(12) United States Patent
Epifano

(10) Patent No.: US 9,118,285 B2
(45) Date of Patent: Aug. 25, 2015

(54) COMPENSATION OF A TRANSMITTER DISTORTION

(75) Inventor: Fabio Epifano, Segny (IT)

(73) Assignee: ST-ERICSSON SA, Plan-les-Ouates (CH)

( * ) Notice: Subject to any disclaimer, the term of this patent is extended or adjusted under 35 U.S.C. 154(b) by 65 days.

(21) Appl. No.: 14/002,378

(22) PCT Filed: Mar. 16, 2012

(86) PCT No.: PCT/EP2012/054692
§ 371 (c)(1),
(2), (4) Date: Sep. 11, 2013

(87) PCT Pub. No.: WO2012/126845
PCT Pub. Date: Sep. 27, 2012

(65) Prior Publication Data
US 2013/0344827 A1      Dec. 26, 2013

Related U.S. Application Data

(60) Provisional application No. 61/479,683, filed on Apr. 27, 2011.

(30) Foreign Application Priority Data

Mar. 18, 2011    (EP) ..................................... 11305312

(51) Int. Cl.
*H04B 1/04* (2006.01)
*H04K 1/02* (2006.01)
(Continued)

(52) U.S. Cl.
CPC ............ *H03F 1/3247* (2013.01); *H04B 1/0475* (2013.01); *H04B 1/30* (2013.01); *H04L 27/364* (2013.01); *H04L 27/0002* (2013.01); *H04L 2027/0016* (2013.01)

(58) Field of Classification Search
USPC ......... 455/114.2, 114.3, 226.1; 375/296–297; 330/149
See application file for complete search history.

(56) References Cited

U.S. PATENT DOCUMENTS 6,704,551 B2    3/2004    Riou et al.
6,931,343 B2    8/2005    Webster et al.
(Continued)

OTHER PUBLICATIONS

International Search Report issued in corresponding International application No. PCT/EP2012/054692, date of mailing Aug. 24, 2012.

*Primary Examiner* — Nguyen Vo
(74) *Attorney, Agent, or Firm* — Patent Portfolio Builders PLLC

(57) ABSTRACT

There is described a method for compensating the phase and gain distortions of a transmitter analog front end affected by a leakage of a local oscillator. The method comprises generating a single complex tone signal in a digital front end, wherein the generation comprises compensating the signal gain and phase with gain and phase offsets. The method comprises feeding the compensated signal into the transmitter analog front end. The method comprises feeding a corresponding output signal of the transmitter analog front end into a nonlinear component, thereby generating an inter-modulation between the complex tone signal and at least one tone signal due to the local oscillator leakage. The method comprises feeding the output of the nonlinear component into a measurement receiver analog front end. The method comprises filtering the output of the measurement receiver analog front end with a band pass filter in order to isolate the intermodulation, which is indicative of the distortions introduced by the transmitter analog front end. The method comprises measuring the power of the filtered signal. The method comprises updating the gain and phase offsets according to the measured power, by reducing said measured power. The disclosure also relates, in particular, to a digital front end, to an analog system, to a telecommunication device, to a computer program, and to a storage medium.

18 Claims, 6 Drawing Sheets

(51) Int. Cl.
*H04L 25/03* (2006.01)
*H04L 25/49* (2006.01)
*H03F 1/32* (2006.01)
*H04B 1/30* (2006.01)
*H04L 27/36* (2006.01)
*H04L 27/00* (2006.01)

(56) References Cited

U.S. PATENT DOCUMENTS

| | | | |
|---|---|---|---|
| 7,333,423 B2 * | 2/2008 | Palaskas et al. | 370/210 |
| 7,782,928 B2 | 8/2010 | Kang et al. | |
| 7,856,048 B1 | 12/2010 | Smaini et al. | |
| 8,224,268 B2 * | 7/2012 | Largey et al. | 455/115.2 |
| 8,295,845 B1 * | 10/2012 | Abdollahi-Alibeik et al. | 455/445 |
| 8,526,533 B2 * | 9/2013 | Sen et al. | 375/296 |
| 2002/0177425 A1 | 11/2002 | Li | |
| 2005/0148304 A1 | 7/2005 | Jerng | |
| 2005/0164648 A1 | 7/2005 | Gannholm | |
| 2009/0088086 A1 | 4/2009 | Vassiliou et al. | |
| 2010/0099363 A1 | 4/2010 | Faust et al. | |
| 2010/0184392 A1 | 7/2010 | Largey et al. | |
| 2010/0232493 A1 | 9/2010 | Thirumoorthy | |

* cited by examiner

COMPENSATION OF A TRANSMITTER DISTORTION

BACKGROUND

1. Technical Field

The present invention generally relates to devices and methods for compensating a transmitter distortion.

2. Related Art

Telecommunication devices typically comprise a transmitter and a receiver.

The transmitter and the receiver are typically not perfect due, for example, to process variation during their manufacturing.

Distortions (due for example to RF imperfections of RF transmitters and/or RF receivers) may be compensated by using external equipment for measuring and computing the compensation values for the transmitter and/or receiver. External equipments are however inconvenient, as they are not necessarily easily available to the user of the telecommunication device embedding the RF transmitter and RF receiver. In addition, long data transfers between the telecommunication device (for example a mobile phone) and the external equipments may be required. In practice such distortions compensations are often configured in a factory when manufacturing a telecommunication device.

It has been proposed to introduce a measurement receiver (distinct from the aforementioned regular receiver) in certain wireless transmitters in order to perform some measurements on the signal that the transmitter is to radiate.

Signals are often represented by in-phase and quadrature components (hereafter referred to as IQ). The transmitter and/or the receiver may introduce IQ gain and phase distortions, which are not desirable.

SUMMARY

To address these needs, an aspect of the present invention relates to a method of providing gain and phase offsets for compensating the phase and gain distortions of a transmitter analog front end. The method may be implemented in a digital front end and is advantageous for finding compensation parameters for a transmitter analog front end affected by a leakage of a local oscillator.

The method comprises:
- generating a single complex tone signal, wherein the generating comprises compensating the signal gain and phase with gain and phase offsets,
- sending the compensated signal to the transmitter analog front end,
- receiving a corresponding output signal from a receiver analog front end,
- filtering the received signal in order to isolate an inter-modulation signal, which is indicative of distortions introduced by the transmitter analog front end,
- measuring the power of the filtered signal, and
- updating the gain and phase offsets, and repeating the generating, sending, receiving, filtering and measuring steps above,
- comparing the measured power before and after the updating step; and
- selecting the gain and phase offsets associated with the lowest measured power.

Another aspect of the invention relates to a digital front end comprising:
- a tone generator arranged to generate a single complex tone signal and sending it to a transmitter analog front end,
- a compensation unit arranged to cause the tone generator to compensate the gain and phase of the single complex tone signal generated by the tone generator,
- a filter arranged to filter a signal received from a measurement receiver analog front end,
- a power measurement unit arranged to measure the power of a filtered signal output by the band pass filter, and
- an updating unit arranged to update gain and phase offsets used by the compensation unit, and
- a processor arranged to compare values of measured power of the filtered signal associated with different gain and phase offsets and to select the gain and phase offsets associated with the lowest measured power.

A further aspect of the invention relates to a telecommunication device comprising the above-mentioned digital front end.

A further aspect of the invention relates to a telecommunication device comprising the above-mentioned digital front end and further comprising:
- a transmitter analog front end,
- a measurement receiver analog front end,
- a local oscillator, and
- a nonlinear component adapted to feed an output of the transmitter analog front end into an input of the measurement receiver analog front end.

A further aspect of the invention relates to a computer program for carrying out the above mentioned method.

BRIEF DESCRIPTION OF THE DRAWINGS

Embodiments of the present invention are illustrated by way of example, and not by way of limitation, in the figures of the accompanying drawings, in which like reference numerals refer to similar elements and in which.

DESCRIPTION OF PREFERRED EMBODIMENTS

Figure 1:
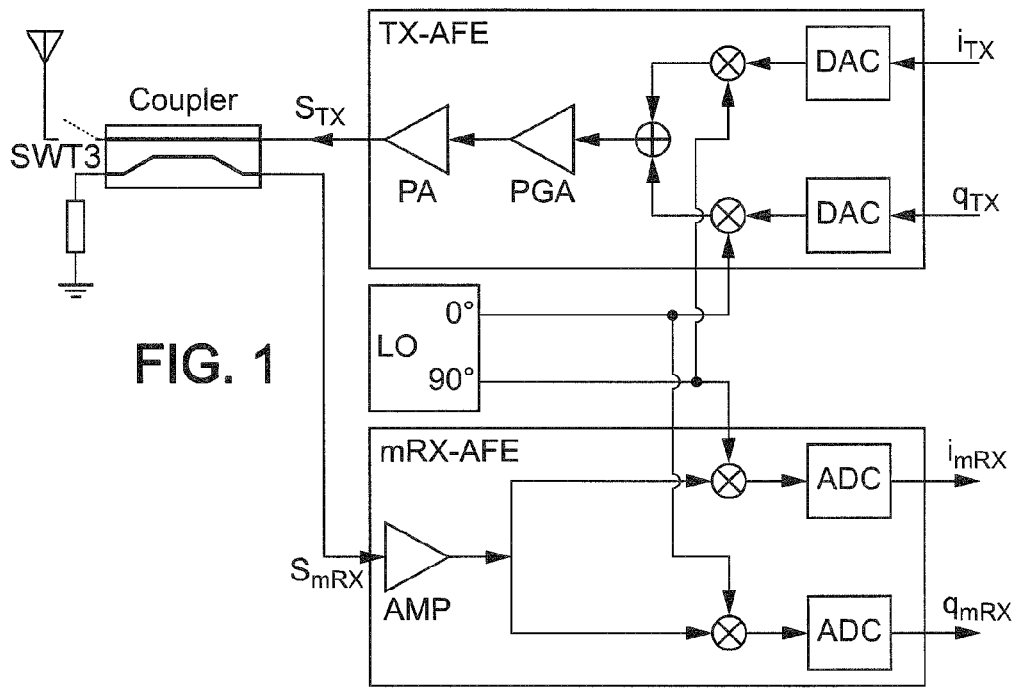
FIG. 1 is a schematic view of a transmitter analog front end and measurement receiver analog front end.

FIG. 1 illustrates a transmitter analog front end TX AFE (fed with IQ transmission signals), and a measurement receiver analog front end mRX AFE (outputting IQ received signals). The transmitter AFE and measurement receiver AFE are connected via a coupler feeding part of the signal output by the transmitter AFE into the measurement receiver AFE. The coupler is located between the transmitter AFE and the antenna used by the transmitter AFE.

In order to compensate imperfections with a measurement receiver it is typically assumed that the measurement receiver is perfect or, at least, much less imperfect than the transmitter. If no external equipment is used, means to measure/quantify imperfections are typically required. Indeed, transmitter imperfections are mixed with measurement receiver imperfections, and there is no known IQ calibration technique to separate the two distinct imperfections from the mixed imperfection.

The fact that that transmitter imperfections and measurement receiver imperfections in a system as depicted on FIG. 1 cannot be separated with known techniques can be explained as follows.

A base-band transmit signal can be represented as a complex signal:

$$s_{TX-BB}(t) = i_{TX-BB}(t) + j \cdot q_{TX-BB}(t)$$

where $i_{TX-BB}$ and $q_{TX-BB}$ represent the I and Q components.

A corresponding up-converted signal can typically be written as follows:

$$s_{TX-RF}(t) = g_{TX} \cdot \left[ \left(1 + \frac{\varepsilon_{TX}}{2}\right) \cdot i_{TX}(t - \tau_{TX}) \cdot \cos\left(2 \cdot \pi \cdot f_{RF} \cdot (t - \tau_{TX}) + \frac{\theta_{TX}}{2}\right) - \left(1 - \frac{\varepsilon_{TX}}{2}\right) \cdot q_{TX}(t - \tau_{TX}) \cdot \sin\left(2 \cdot \pi \cdot f_{RF} \cdot (t - \tau_{TX}) - \frac{\theta_{TX}}{2}\right) \right]$$

where $g_{TX}$ is the transmitter gain, $\tau_{TX}$ is the transmitter delay, $\varepsilon_{TX}$ and $\theta_{TX}$ are the transmitter I and Q gain and phase mismatches, and $f_{RF}$ is the carrier frequency.

A corresponding received signal input into the measurement receiver is:

$$s_{mRX-RF}(t) = g_{COUPLER} \cdot s_{TX-RF}(t - \tau_{COUPLER})$$

where $g_{COUPLER}$ and $\tau_{COUPLER}$ are the gain (or loss) and the coupler delay.

The base-band received signal output by the measurement receiver is then:

$$i_{mRX-BB}(t) = 2 \cdot \left(1 + \frac{\varepsilon_{mRX}}{2}\right) \cdot s_{mRX-RF}(t) \cdot g_{mRX} \cdot \cos\left(2 \cdot \pi \cdot f_{RF} \cdot (t - \tau_{mRX}) + \frac{\theta_{mRX}}{2}\right)$$

$$q_{mRX-BB}(t) = -2 \cdot \left(1 - \frac{\varepsilon_{mRX}}{2}\right) \cdot s_{mRX-RF}(t) \cdot g_{mRX} \cdot \sin\left(2 \cdot \pi \cdot f_{RF} \cdot (t - \tau_{mRX}) - \frac{\theta_{mRX}}{2}\right)$$

Where $g_{mRX}$ is the measurement receiver gain, $\tau_{mRX}$ is the measurement receiver delay, $\varepsilon_{mRX}$ and $\theta_{mRX}$ are the measurement receiver I and Q gain and phase mismatches.

By developing the equations, the base-band received signal (a loop-back signal) is in fact:

$$i_{mRX-BB}(t) = g_{LOOP} \cdot \left(1 + \frac{\varepsilon_{mRX}}{2}\right) \cdot \left(1 + \frac{\varepsilon_{TX}}{2}\right) \cdot i_{TX}(t - \tau_{LOOP}) \cdot$$

$$\cos\left(\frac{\theta_{TX}}{2} - \frac{\theta_{mRX}}{2} - \theta_{LOOP}\right) + g_{LOOP} \cdot \left(1 + \frac{\varepsilon_{mRX}}{2}\right) \cdot$$

$$\left(1 - \frac{\varepsilon_{TX}}{2}\right) \cdot q_{TX}(t - \tau_{LOOP}) \cdot \sin\left(\frac{\theta_{TX}}{2} + \frac{\theta_{mRX}}{2} + \theta_{LOOP}\right)$$

$$q_{mRX-BB}(t) = g_{LOOP} \cdot \left(1 - \frac{\varepsilon_{mRX}}{2}\right) \cdot \left(1 + \frac{\varepsilon_{TX}}{2}\right) \cdot i_{TX}(t - \tau_{LOOP}) \cdot$$

$$\sin\left(\frac{\theta_{TX}}{2} + \frac{\theta_{mRX}}{2} - \theta_{LOOP}\right) + g_{LOOP} \cdot \left(1 - \frac{\varepsilon_{mRX}}{2}\right) \cdot$$

$$\left(1 - \frac{\varepsilon_{TX}}{2}\right) \cdot q_{TX}(t - \tau_{LOOP}) \cdot \cos\left(-\frac{\theta_{TX}}{2} + \frac{\theta_{mRX}}{2} - \theta_{LOOP}\right)$$

where $g_{LOOP} = g_{TX} \, g_{mRX} \, g_{COUPLER}$ and $\theta_{LOOP} = 2\pi f_{LO} \, (\tau_{TX} + \tau_{COUPLER} + \tau_{mRX})$.

It is therefore apparent that absent any further information, the problem cannot be solved as the number of unknowns is greater than the number of available equations.

Figure 11:
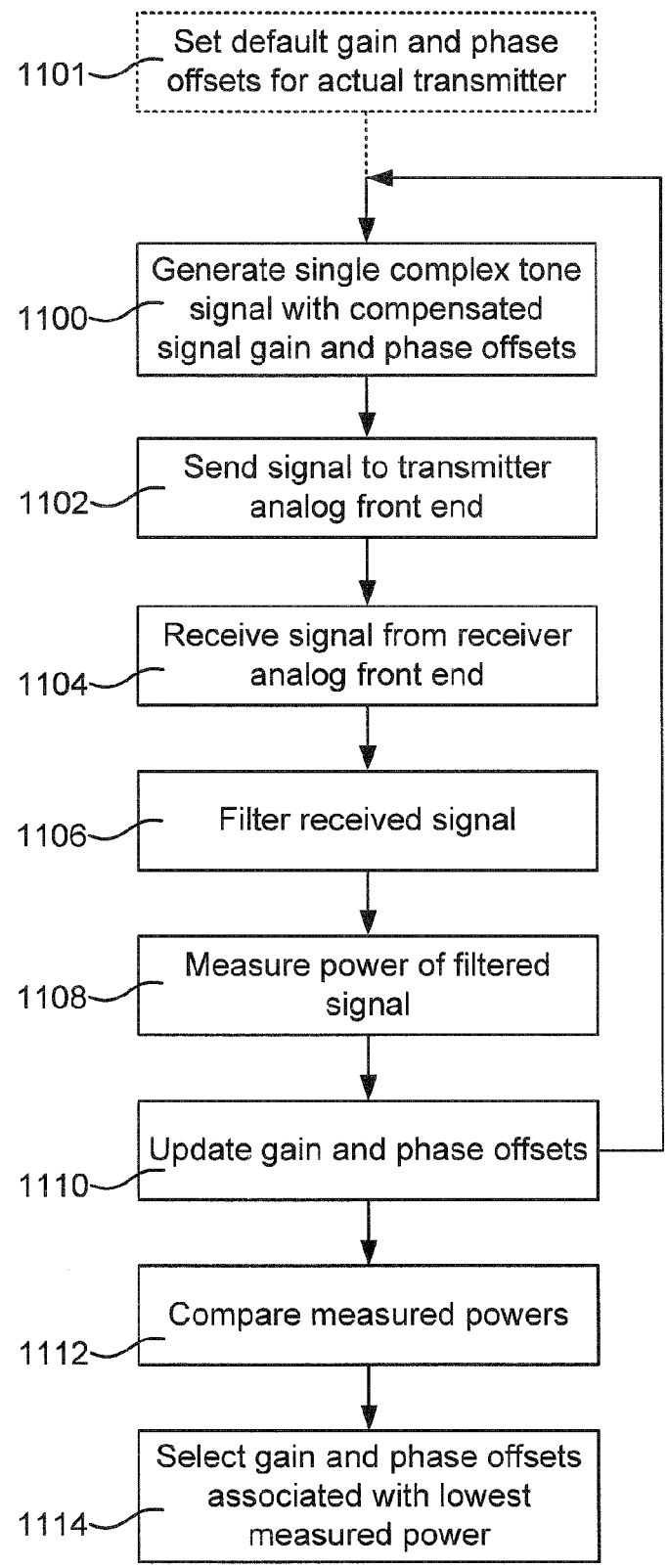
FIG. 11 is a flow chart illustrating methods according to embodiments.

FIG. 11 is a flow chart illustrating methods according to embodiments demonstrated below. A single complex tone signal with compensated signal gain and phase offsets is generated 1100. Optionally, the gain and phase offsets are initially set 1101 to default values, e.g. depending on properties of the TX AFE. The generated signal is sent 1102 to the TX AFE. A signal is received 1104 from the RX AFE. The received signal is filtered 1106 to isolate an intermodulation signal which is indicative of distortions introduced by the TX AFE. The power of the filtered signal is measured 1108. Gain and phase offsets are updated 1110 and provided for generation of a new single complex tone signal with compensation based on the updated gain and phase offsets. The measured powers before and after updating are compared 1112. The gain and phase offsets associated with the lowest measured power is selected 1114. The repetition with updated gain and offset values can be repeated until the gain and/or phase offsets has converged.

According to a first embodiment, a method for compensating the phase and gain distortions of a transmitter analog front end affected by a leakage of a local oscillator comprises a first step /1/ of generating 1100 a single complex tone signal in a digital front end, wherein the generation 1100 comprises compensating the signal gain and phase with gain and phase offsets. By "single complex tone", it is understood that two tones are never simultaneously generated. Only one tone at a time is generated, and constitutes a kind of test signal which is usable to probe the transmitter and assess its phase and gain distortions. It is possible to generate the single tone, and then to process the generated single tone in order to compensate its phase and gain. Alternatively, it is possible to directly generate a compensated single tone by taking into account the desired phase and gain offsets (as input parameters in the tone generation). The generation of the single tone can be carried out with a digital signal processor (DSP). The DSP can be set to generate the single tone (with given characteristics) and then continuously generate this signal (with said characteristics), until otherwise instructed. In other words, the DSP can continue to generate the tone according to the prescribed characteristics in parallel with the execution of subsequent steps /2/, /3/, etc. until another step (e.g. step /7/below) changes the characteristics of the single tone to be generated.

In a second step /2/, the method feeds 1102 the compensated single tone signal into the transmitter analog front end. The transmitter analog front end is in charge, in particular, of converting the digital output of the digital front end into an analog signal, via a digital to analog converter (DACs). The analog signal can then be fed into an antenna for wireless transmission. The single complex tone can have I and Q components and there can be two DACs, one for each of the I and Q components.

In a third step /3/, the method comprises feeding a corresponding output signal of the transmitter analog front end into a nonlinear component, thereby generating an inter-modulation between the complex single tone signal and at least one tone signal due to the local oscillator leakage. Since only one tone is generated in step /1/, the inter-modulation involves only this single tone and the signal(s) due to the local oscillator leakage. This results in the inter-modulation being representative of this single tone and more specifically of how this single tone is distorted by the transmitter. The output signal of the transmitter analog front end can be the output of a mixer mixing the output of two DACs (one for each of the I and Q components of the single tone). This output can be tapped from different locations in the transmitter analog front end. Indeed, the transmitter AFE can conventionally comprise, after the mixer, a programmable gain amplifier PGA (amplifying the signal from the mixer by a factor which is programmable). The transmitter AFE can also comprise, after the PGA, a power amplifier PA, which is typically used to strongly amplify the signal in order that that the power that is radiated on an antenna connected to the transmitter AFE be sufficient (while not uselessly high) for the signal to be properly received by a base station or other receiving equipment. Accordingly, a transmitter AFE according to an embodiment of the invention can comprise a PA, a PGA, or both a PA and a PGA. Accordingly, the output of a transmitter AFE according to an embodiment can be tapped directly after the mixer, or in case there is a PA and/or a PGA, after the PGA or after the PA. Tapping the output further in the chain, for example after the PA (when both a PGA and a PA are present) is advantageous since the output is representative of the distortions introduced by a more substantial part of the transmitter AFE, therefore the estimated distortions are a priori more likely to reflect the real distortions of the whole transmitter AFE.

In a fourth step /4/, the method comprises feeding the nonlinearly amplified signal into a measurement receiver analog front end. This nonlinearly amplified signal can be fed into different locations in the measurement receiver AFE. Indeed, the measurement receiver AFE can conventionally comprise, before the mixer, an amplifier AMP (which can be a PGA) in order to optimally adapt the power of the received signal to the capabilities of the analog to digital converters (ADCs). The amplifier AMP can therefore amplify the signal positively if the received signal is very weak (in order to benefit from the full range or at least from a greater range of the ADC), or negatively (i.e. attenuate the signal) in case the received signal is too strong. In particular, if the output signal of the transmitter AFE tapped in step /3/ was tapped after the PA, it is typically necessary to attenuate the signal. On the other hand, if the output signal of the transmitter AFE tapped in step /3/ was tapped just after the mixer of the transmitter AFE (before any amplification), it is typically superfluous to feed the signal in an amplifier. Accordingly, the nonlinearly amplified signal can be fed either before the amplifier (in case there is an amplifier) or just before the mixer (after the amplifier, if there is no amplifier, or if the amplifier is not required due to the location in which the output signal was tapped). While tapping the output further in the chain, for example after the PA (when both a PGA and a PA are present) is advantageous since the output is representative of the distortions introduced by a more substantial part of the transmitter AFE, this may require feeding the nonlinearly amplified signal before the amplifier of the measurement receiver AFE, which amplifier may introduce undesired distortions which may alter the compensation of the gain and phase distortion of the transmitter AFE. However the distortions of the measurement receiver AFE may be assumed to be lower than the distortions of the transmitter AFE. Those skilled in the art can (on a case by case basis) easily determine which of the distortions introduced by the measurement receiver AFE or the distortions introduced by not optimally using the operating range of the ADCs of the measurement receiver AFE are most detrimental, and accordingly make a choice. A trivial (but not necessarily optimal) choice consists in feeding the signal before the amplifier if the output signal was an amplified signal (by PGA, PA or both) and feeding the nonlinearly amplified signal just before the mixer of the measurement receiver AFE if the output signal was tapped just after the mixer of the transmitter AFE. That is, the output of the measurement receiver is received 1104 from the receiver AFE.

In a fifth step /5/, the method comprises filtering 1106 the output of the measurement receiver analog front end (i.e. a digital output of the DACs of the measurement receiver AFE) with a band pass filter in order to isolate the inter-modulation, which is indicative of the distortions introduced by the transmitter analog front end. The band pass filter can be implemented in the form of a digital filter (e.g. a piece of software executed by a DSP).

In a sixth step /6/, the method comprises measuring 1108 the power of the filtered signal. This power measurement can be carried out by a mathematical computation carried out by a processor on the basis of the filtered signal, in a conventional manner.

In a seventh step /7/, the method comprises updating 1110 the gain and phase offsets according to the measured power, by reducing said measured power.

The first six steps can be run in parallel for a duration corresponding to several periods of the tone, after which the power measurement of step /6/ can be expected to stabilize and to be used as a reliable input to step /7/.

According to a further embodiment, the method according to the first embodiment uses, as a nonlinear component, a nonlinear amplifier. The nonlinear amplifier is preferably chosen so as to generate substantial inter-modulation. In general, inter-modulation is perceived as a defect in amplifiers, and measures are taken in order to limit them as much as possible. However in the context of this embodiment, the inter-modulation allows determining the gain and phase distortions of the transmitter AFE. It is possible to use a low quality PA or PGA. Unlike the (optional) PA and PGA of the transmitter AFE, and unlike the (optional) amplifier of the measurement receiver AFE, the nonlinear amplifier according to this embodiment connects an output of the transmitter AFE to an input of the measurement receiver AFE.

According to a further embodiment, the method according to the first or second embodiment initially sets 1101 the gain and phase offsets to default values depending on the transmitter analog front end. For example, the default values may be based on an initial assessment of the distortions in the factory that manufactured the transmitter AFE. This is advantageous as it allows a faster determination of the gain and phase distortion, provided the initial values are close to the real values.

Alternatively, the gain and phase offsets are initially set to zero.

According to a further embodiment, the method according to any of the previous embodiments comprises repeating step /7/ until each of the gain and phase offsets has converged. This is advantageous, since a single iteration is not guaranteed to provide immediately the best estimate of the gain and phase distortions.

According to a further embodiment, the method according to any of the previous embodiments generates a single complex tone signal of the form:

$$i_{TX-BB}(t)=A\cdot\cos(2\pi f_{BB}\cdot t), q_{TX-BB}(t)=A\cdot\sin(2\pi f_{BB}\cdot t)$$

This correspond to a perfect tone of amplitude A and frequency $f_{BB}$.

According to a further embodiment, the method according to the fifth embodiment comprises the band pass filter isolating, in step /5/, an inter-modulation signal located around frequency $3*f_{BB}$. This is advantageous as frequency $3*f_{BB}$ is the frequency that best reflects the inter-modulation and therefore best reflects the distortions introduced by the transmitter AFE.

The powers measured before and after the updating 1110 are compared 1112, and the gain and phase offsets corresponding to the lowest measured power are selected 1114.

Figure 13:
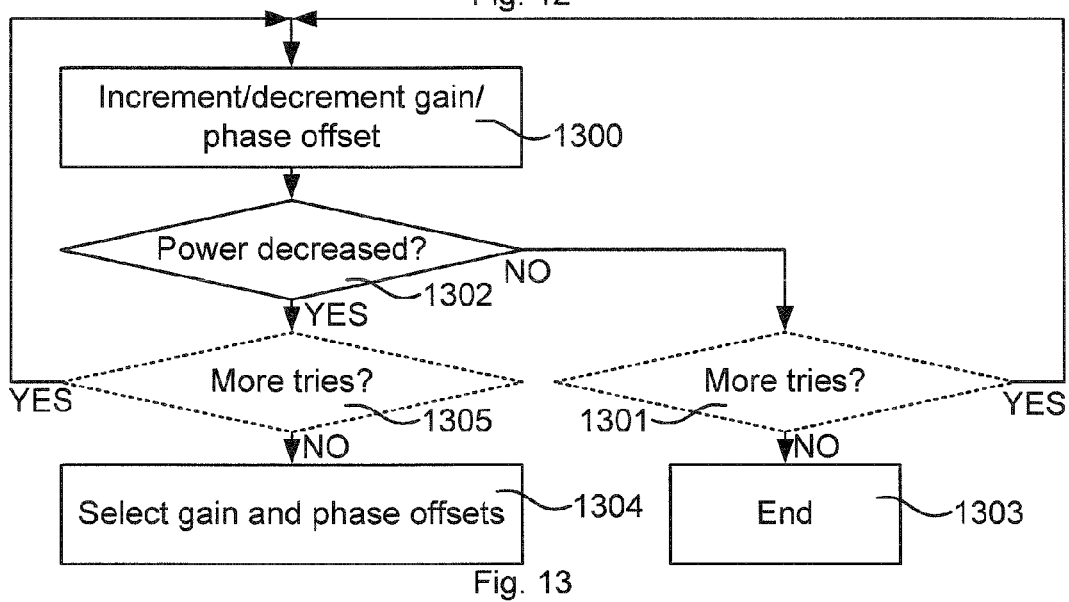
FIG. 13 is a flow chart illustrating details of a method according to embodiments.
Figure 14:
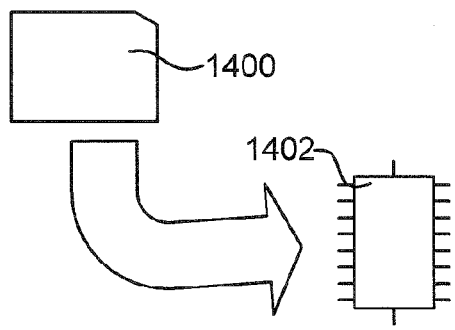
FIG. 14 schematically illustrates a non-transitory computer readable storage medium arranged to store a computer program, and an information processing system.

FIG. 13 is a flow chart illustrating details of a method according to embodiments demonstrated below. An increment or decrement of gain or phase offset is performed 1300. It is determined 1302 whether power of the filtered signal decreased upon the increment or decrement.

If the power decreased, the gain and phase offsets are selected 1304. Optionally, before selecting 1304 the gain and phase offsets, it can be determined 1305 if further values of gain and/or phase offsets should be tried. If so, the procedure returns to the increment/decrement step 1300.

If the power did not decrease, as determined 1302, the procedure ends 1303. Optionally, before ending 1303 the process, it can be determined 1301 if further values of gain and/or phase offsets should be tried. If so, the procedure returns to the increment/decrement step 1300.

According to a further embodiment, the method according to any of the previous embodiments, comprises, in step /7/:
/a/ temporarily updating 1300 the gain or phase offset according to one of:
  /a1/ incrementing the gain offset,
  /a2/ decrementing the gain offset,
  /a3/ incrementing the phase offset,
  /a4/ decrementing the phase offset;
/b/ comparing 1302 the power previously measured in step /6/ and the power measured after carrying out steps /1/ to /6/ again with gain and phase offsets temporarily updated according to step /a/. The values of the gain and phase offsets before temporary update are backed up in order to be restored in case the temporary update turns out not to be satisfactory;
/c/ if the measured power has decreased, validating 1304 the temporary update of step /a/ as the update according to step /7/, otherwise starting over from step /a/ with a different temporary update 1300, or not updating 1301, 1303 the offsets if all possible temporary updates of step /a/ failed to reduce the measured power. If the measured power has decreased and step /c/ is over, it is still possible, in accordance with the fourth embodiment, to repeat 1305 step /7/ until step /c/ does not change (or does not substantially change) the value of the gain and phase offsets. In a variant, instead of leaving step /c/ as soon as a gain offset or phase offset temporary update reduces the measured power, it is possible to try the four possible gain offset and phase offset temporary updates and to select the one which most reduces the measured power.

According to an further embodiment, the method according to the seventh embodiment comprises temporarily updating the offsets first according to step /a1/, then, if step /a1/ does not reduce the measured power, according to step /a2/, then, if step /a2/ does not reduce the measured power, according to step /a3/ and lastly, if step /a3/ does not reduce the measured power, according to step /a4/. More generally, it may be useful to try modifying the gain offset before modifying the phase offset.

According to a further embodiment, the method according to the seventh or eighth embodiment comprises using a same gain increment for steps /a1/ and /a2/ and a same phase increment for steps /a3/ and /a4/, the method comprising, after step /c/, halving the gain and/or phase increment if step /c/ did not update any of the offsets. This is advantageous as this allows initially carrying out a quick search with high valued increments, and when the search converges by not updating the offsets, the use of smaller increments allows continuing the search with finer tuning.

According to a further embodiment, the method according to any of the previous embodiments uses as the output signal of step /3/ a signal output by a mixer mixing the results of digital to analog conversions of IQ components of the compensated signal injected in step /2/ (before amplification, if any).

According to a further embodiment, a computer program product comprises one or more stored sequences of instructions that are accessible to a processor and which, when executed by the processor, cause the processor to carry out the steps of any of the previous method embodiments. The computer program may for example be written in C language or in assembly language.

The present invention can therefore be embedded in a computer program product, which comprises all the features enabling the implementation of the methods described herein, and which—when loaded in an information processing system 1402—is able to carry out these methods. Computer program means or computer program in the present context mean any expression, in any language, code or notation, of a set of instructions intended to cause a system having an information processing capability to perform a particular function either directly or after conversion to another language.

According to a further embodiment, a non-transitory computer readable storage medium 1400 stores a computer program according to the eleventh embodiment. The storage medium may be a memory component soldered or otherwise attached to a motherboard of a cellular phone.

Such medium allows data, instructions, messages or message packets, and other machine readable information to be read from the medium. The medium may include non-volatile memory, such as ROM, Flash memory, Disk drive memory, CD-ROM, and other permanent storage. Additionally, the medium may include, for example, volatile storage such as RAM, buffers, cache memory, and network circuits. Furthermore, the medium may comprise computer or machine readable information in a transitory state medium such as a network link and/or a network interface, including a wired network or a wireless network, that allow a device to read such computer or machine readable information.

Figure 12:
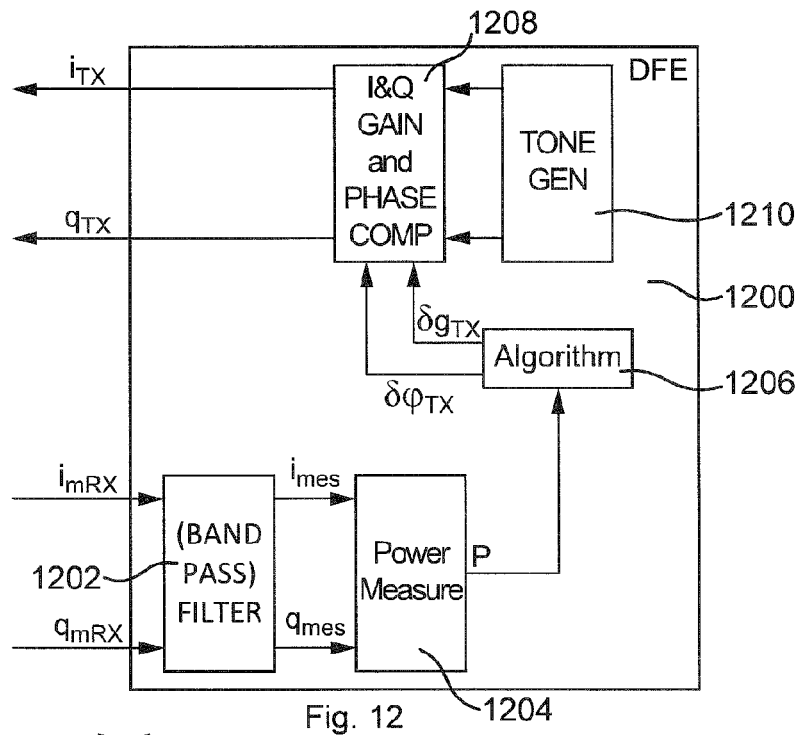
FIG. 12 schematically illustrates a digital front end according to embodiments.

FIG. 12 schematically illustrates a digital front end DFE 1200 according to embodiments demonstrated below. The DFE 1200 comprises an input for receiving a complex measured receive signal $i_{mRX}$, $q_{mRX}$ which is connected to a filter 1202, e.g. a bandpass filter. The filter 1202 provides a filtered complex signal $i_{mes}$, $q_{mes}$, which represents an isolated inter-modulation signal indicative on distortions introduced by the TX AFE, to a power measurement entity 1204. The power measurement entity 1204 provides a signal representing the measured power P to an algorithm entity 1206 which provides updated gain and phase offsets $\delta g_{TX}$, $\delta \phi_{TX}$ to an in-phase and quadrature gain and phase compensator 1208. A tone generator 1210 provides a complex tone signal to the in-phase and quadrature gain and phase compensator 1208 such that the in-phase and quadrature gain and phase compensator 1208 provides a single complex tone signal $i_{TX}$, $q_{TX}$ to an output of the DFE 1200.

According to a further embodiment, a digital front end comprises:

a tone generator for generating a complex tone signal and sending it to a transmitter analog front end, a compensation unit for causing the tone generator to compensate the gain and phase of a single complex tone signal generated by the tone generator, a band pass filter for filtering a signal received from a measurement receiver analog front end, a power measurement unit for measuring the power of a filtered signal output by the band pass filter, and an updating unit for updating gain and phase offsets used by the compensation unit according to a power measured by the power measurement unit.

The thirteenth embodiment may be implemented in a single chip (built for example around a DSP).

The tone generator is arranged to generate a single complex tone signal. The tone constitutes a kind of test signal which is usable to probe the transmitter and asses its phase and gain distortions. The generation of the single complex tone signal can be carried out by a digital signal processor.

The compensation unit is arranged to apply set gain and phase offsets to the single complex tone signal. Thus, the compensated complex signal $i_{TX}$, $q_{TX}$ is provided to a transmitter analog front end.

The band pass filter is arranged to filter the complex signal $i_{mRX}$, $q_{mRX}$ and provide a complex signal $i_{mes}$, $q_{mes}$ for measuring. The band pass filter is arranged to filter out intermodulation products, and can be arranged to filter out third order intermodulation product frequencies at $3*f_{BB}$, i.e. at three times the baseband frequency, or be arranged to filter out both second and third order intermodulation product frequencies ranging from about $2*f_{BB}$ to about $3*f_{BB}$. Here, it should be noted that a band pass filter is advantageous for isolating intermodulation products, but also other types of filters may be feasible.

The power measurement unit is arranged to provide a measurement of the output power P of the filtered signal $i_{mes}$, $q_{mes}$, i.e. the power of the intermodulation product(s). The power measurement can include being carried out by a mathematical computation carried out by a processor on the basis of the filtered signal.

The updating unit is arranged to provide an updated set of gain and phase offsets $\delta \phi_{TX}$, $\delta g_{TX}$ to be tried. The selection of the updated gain and phase offsets $\delta \phi_{TX}$, $\delta g_{TX}$ is made according to any of the algorithms demonstrated in this disclosure. The compensation unit applies the updated gain and phase offsets $\delta \phi_{TX}$, $\delta g_{TX}$.

Figure 10:
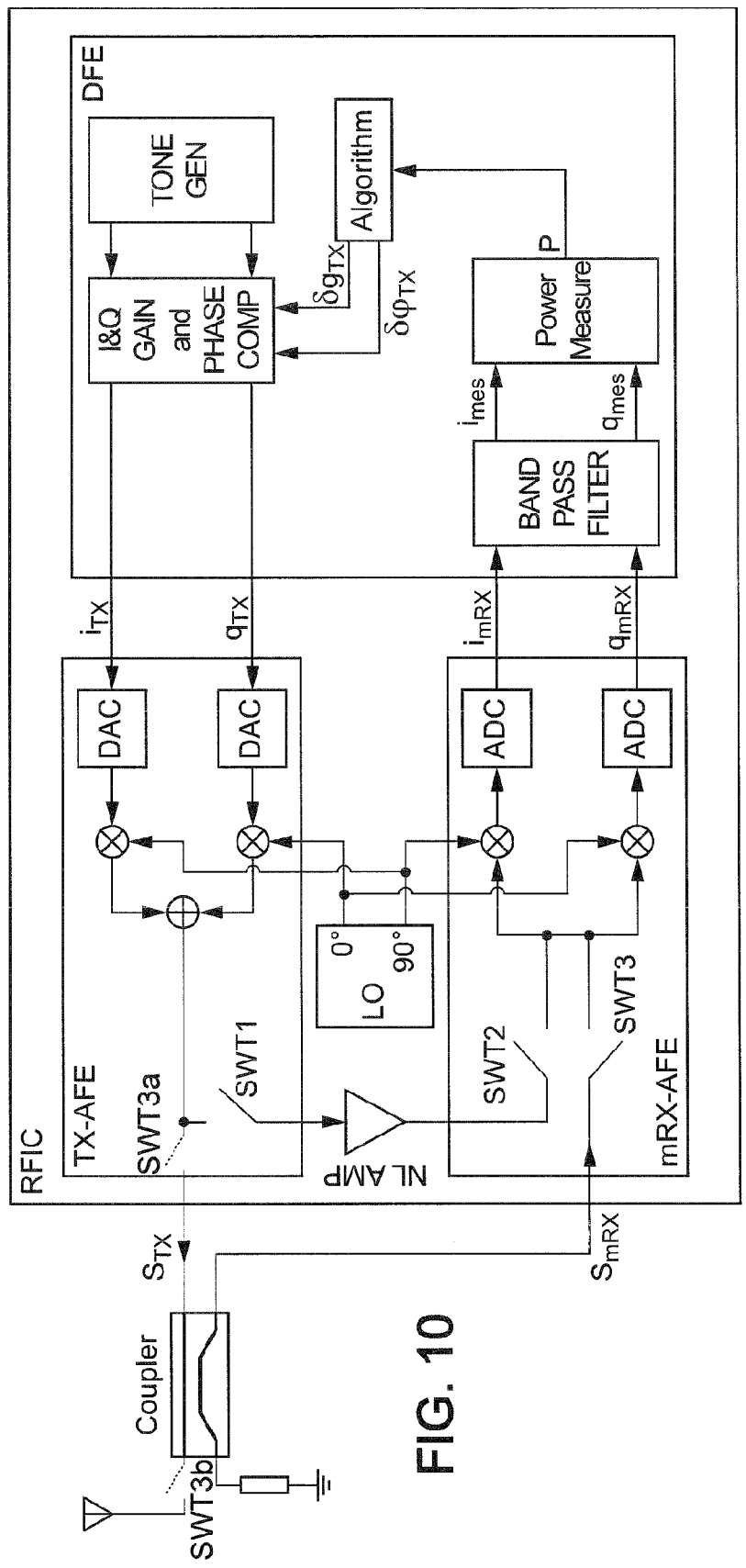
FIG. 10 represents a schematic view of components of a telecommunication device according to an embodiment.

It should be understood that the digital front end as demonstrated above and depicted in FIG. 12 can be used together with analog front ends as those described with reference to FIGS. 1 and 10.

According to a further embodiment, an analog system comprises:

a transmitter analog front end,
a measurement receiver analog front end,
a local oscillator, and
a nonlinear component for generating an inter-modulation signal between at least one tone signal due to a leakage of the local oscillator and an output of the transmitter analog front end, and for feeding the output of the transmitter analog front end and the inter-modulation signal into an input of the measurement receiver analog front end.

According to an embodiment, the analog system comprises at least one switch for disconnecting the nonlinear component from the transmitter analog front end and from the measurement receiver analog front end. For example, as illustrated on FIG. 10, the nonlinear component may be a nonlinear amplifier NL AMP. A switch SWT1 may be used to connect/disconnect the nonlinear amplifier NL AMP from the transmitter AFE and a switch SWT2 may be used to connect/disconnect the nonlinear amplifier NL AMP from the measurement receiver AFE. It is also possible to provide a switch SWT3 for connecting/disconnecting the measurement receiver AFE from its antenna (to which it can be connected through a coupler) thereby enabling avoiding reception of parasitic signals during the assessment of the gain and phase offset. If the measurement receiver comprises an amplifier before the mixer, the switch SWT3 may be either before the amplifier or after the amplifier. The switch SWT3 has to be before or parallel to the switch SWT2 (i.e. the switch SWT2 has to be operative when the switch SWT3 disconnects the antenna, otherwise the switch SWT2 would be superfluous), if such switch SWT2 is present. It is also possible to provide another switch SWT3; SWT3*a* or SWT3*b* in order to connect/disconnect the transmitter AFE from its antenna. With such switch, it is possible to avoid broadcasting (through the antenna) the single complex tone that is generated solely for distortion assessment and compensation, and is not a real communication. This is advantageous as such broadcasting could interfere with "real" communications of neighboring transmitter AFEs (e.g. real voice communications of neighboring cell phones). If the transmitter AFE comprises a PA and a PGA, such switch can be before the PGA, between the PGA and the PA, or after the PA, but in any case it has to be after or parallel to the switch SWT1 if such switch is present (i.e. the switch SWT1 has to be operative when the non represented switch disconnects the antenna, otherwise the switch SWT1 would be superfluous). A digital front end as shown on FIG. 10 may comprise a processor for carrying out methods according to embodiments of the invention.

The digital front end according to the thirteenth embodiment and the analog system according to the fourteenth embodiment may be manufactured by different entities, or may be manufactured by the same entity (and be embedded in a single system).

According to a further embodiment, a telecommunication device comprises a digital front end according to the thirteenth embodiment and an analog system according to the fourteenth embodiment.

Such telecommunication device can be, for example, a cellular phone, a PDA, or a laptop computer. The telecommunication device may comprise, for example, GSM, GPRS, 3G, LTE or CDMA radio interfaces.

More precisely, according to some embodiments, a method to perform IQ calibration for both a transmitter and measurement receiver comprises distorting the transmitter up-converter output signal with a nonlinear amplifier before it reaches the measurement receiver down-converter input. In an embodiment, the receiver digital front-end then isolates inter-modulation products to detect the presence of image tones. In a possible embodiment, an iterative algorithm may be used to maximize the TX image rejection. In an embodiment a single-side band transmit signal is used for that purpose.

To explain the operation of embodiments of the present invention, the following idealized assumptions are made:
- transmitter IQ gain and phase mismatches are only introduced in analog base-band blocks (IQ ABB) of the transmitter, which comprise an IQ digital to analog converter (IQ DAC) and an IQ low pass filter (IQ LPF), and in an up-converter block of the transmitter;
- measurement receiver IQ gain and phase mismatches can be introduced in a down-converter block of the measurement receiver and in analog base-band blocks (IQ ABB) of the measurement receiver, which comprise an IQ analog to digital converter (IQ ADC) and an IQ low pass filter (IQ LPF); and
- the RF amplifier does not introduce any IQ gain and phase impairments.

A tone generator is used to generate a complex tone signal (for the purpose of compensating distortions of the transmitter) as follows:

$$i_{TX\text{-}BB}(t) = A \cdot \cos(2 \cdot \pi \cdot f_{BB} \cdot t)$$

$$q_{TX\text{-}BB}(t) = A \cdot \sin(2 \cdot \pi \cdot f_{BB} \cdot t)$$

If the transmitter is perfect, the transmitter output signal is a perfect single side band (SSB) signal centered at $f_{RF} = f_{LO} + f_{BB}$ where $f_{LO}$ is the frequency of a local oscillator of the transmitter, $f_{BB}$ is the frequency of the base band signal (the generated tone signal), and $f_{RF}$ is the frequency of the signal radiated by the antenna behind the transmitter.

Figure 2:
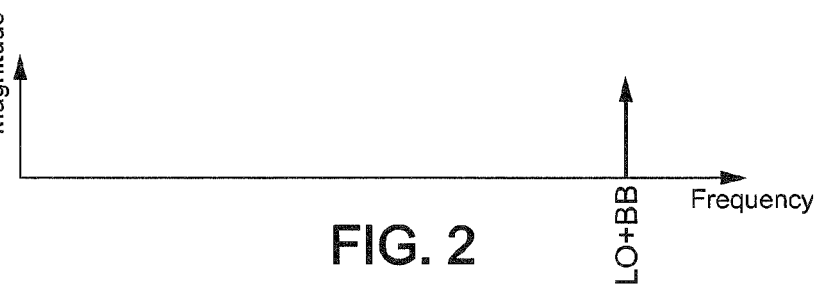
FIG. 2 represents the spectrum of an output signal of a transmitter analog front end without local oscillator leakage or IQ imperfections.

This is illustrated on FIG. 2 which shows the spectrum of an output transmitter signal without local oscillator leakage nor IQ imperfections.

Figure 3:
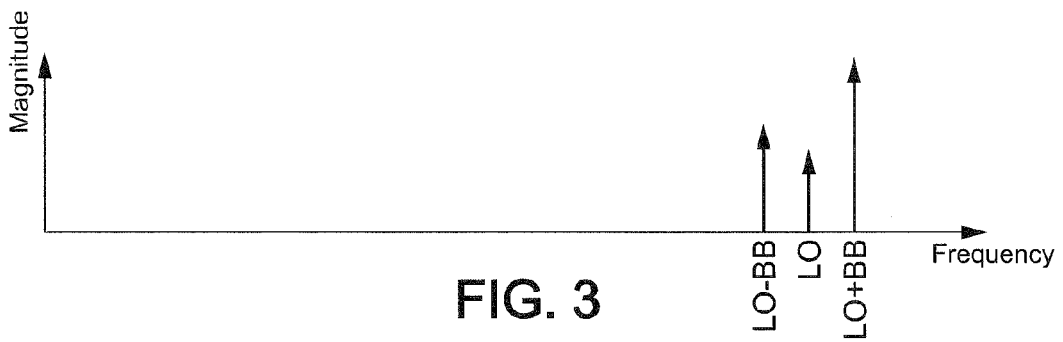
FIG. 3 represents the spectrum of an output signal of a transmitter analog front end with a local oscillator leakage and IQ imperfections.

However a real transmitter typically presents an imperfect image-rejection and local oscillator leakage that causes the presence of a tone at frequencies $f_{IMAGE} = f_{LO} - f_{BB}$ and $f_{LO}$ respectively, as illustrated on FIG. 3.

If the output signal of such real transmitter is fed directly into a measurement receiver, the measurement receiver imperfections are added to the ones introduced by the transmitter, and there is no known technique to assess them. But according to an embodiment, the transmitter output signal is fed first into a nonlinear amplifier (NL-AMP), and the presence of image-rejection tones and LO-leakage tone introduced by the transmitter causes inter-modulations tones to appear.

Figure 4:
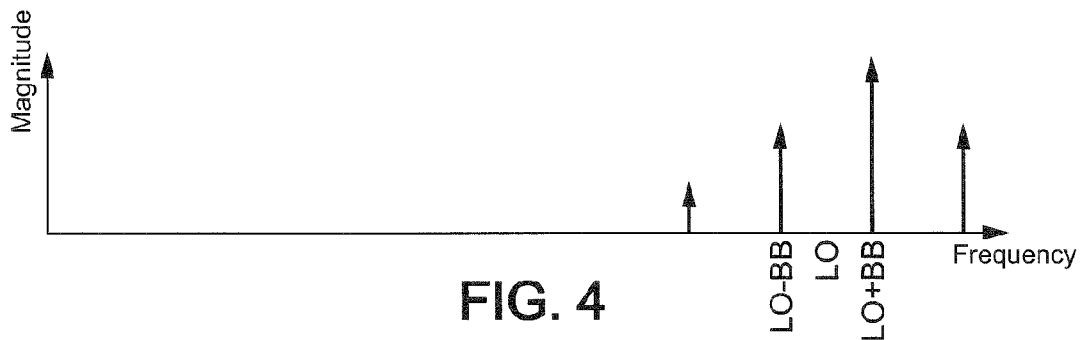
FIG. 4 represents the spectrum of a distorted signal without the leakage of the local oscillator of the transmitter, the leakage at the frequency of the local oscillator having been removed.

According to a first (optional) variant, it is proposed to compensate the transmitter local oscillator leakage and the measurement receiver DC offset in order to reduce the number of undesired tones, as illustrated on FIG. 4, which shows the spectrum of a distorted signal without the leakage of the local oscillator of the transmitter. FIG. 4 also shows two tones (the leftmost one and rightmost one) corresponding to inter-modulation.

Figure 5:
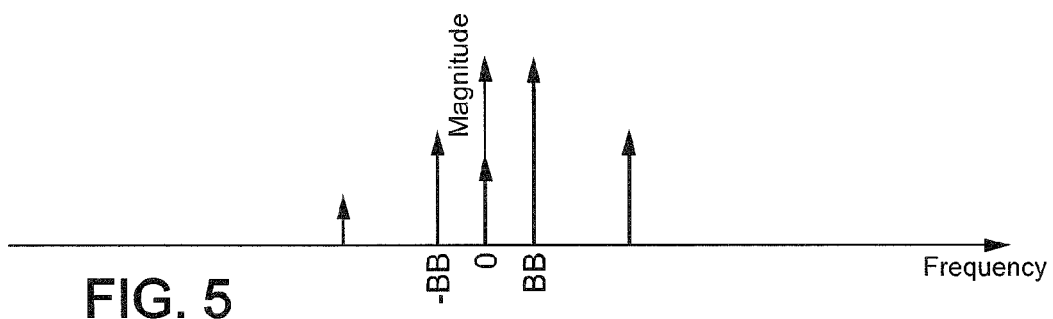
FIG. 5 represents the spectrum of a base band received signal corresponding to the distorted signal which spectrum is shown on FIG. 4.

The base-band received signal is, when local oscillator leakage is compensated, a complex signal whose spectrum is shown on FIG. 5. As shown on FIG. 6, in some embodiments of the invention a band pass filter may be used in order to detect the inter-modulation product due to the presence of the image at frequency $3 \cdot f_{BB}$. The isolated inter-modulation signal to be reduced is illustrated on FIG. 7. Other filter types (such as but not limited to a high pass filter) may be used instead of a band pass filter.

An embodiment of the invention carries out an iterative method. Such iterative method is particularly advantageous when the nonlinearities of the nonlinear amplifier are not well-known (due for example to process variation). Once the inter-modulation product is extracted from the received signal (as explained earlier in particular on FIG. 5), measured power is used as the parameter to be reduced by applying I&Q gain and phase compensation values on the base-band TX signal. The measured power, $P_{mes}$, is a function of $\delta g_{TX}$ and $\delta \phi_{TX}$. The TX signal, i.e. the test signal that is generated and sent through the transmitter, is accordingly adapted so as to reduce the measured power of the inter-modulation product.

An algorithm according to an embodiment of the invention is shown below in commented pseudo code (comments are preceded by two slashes):

```
δg_TX[0] = 0;
// Initially the gain is not compensated.
δφ_TX[0] = 0;
// Initially the phase is not compensated.
P[0] = P(δg_TX[0], δφ_TX[0]);
// Initial reference power measurement.
found = false;
n=0;
while (found == false)
{
n = n + 1;
if      (P[n-1] > P(δg_TX[n-1] +α, δφ_TX[n-1]))
// If the power is reduced by increasing the gain, ...
{
δg_TX[n] = δg_TX[n-1] +α;
// ... then validate the gain increase ...
δφ_TX[n]=δφ_TX[n-1];
// ... do not change the phase ...
P[n] = P(δg_TX[n], δφ_TX[n]);
// ... and measure the power with the new gain and phase.
// Alternatively, retrieve and store
// the measurement done for the above "if" test,
// i.e. P[n]=P(δg_TX[n-1] +α, δφ_TX[n-1]) (an already computed value)
// This avoids another measurement.
}
elseif  (P[n-1] > P(δg_TX[n-1] -α, δφ_TX[n-1]))
// If the power is reduced by decreasing the gain, ...
{
δg_TX[n] = δg_TX[n-1] -α;
// ... then validate the gain decrease ...
δφ_TX[n]=δφ_TX[n-1];
// ... do not change the phase ...
P[n] = P(δg_TX[n], δφ_TX[n]);
// ... and measure the power with the new gain and phase.
// Alternatively, P[n] = P(δg_TX[n-1] -α, δφ_TX[n-1]) (retrieve and store)
}
elseif  (P[n-1] > P(δg_TX[n-1], δφ_TX[n-1] +β))
// If the power is reduced by increasing the phase, ...
{
δg_TX[n] = δg_TX[n-1];
// ... then do not change the gain ...
δφ_TX[n]=δφ_TX[n-1] +β;
// ... validate the phase increase ...
P[n] = P(δg_TX[n], δφ_TX[n]);
// ... and measure the power with the new gain and phase.
// Alternatively, P[n] = P(δg_TX[n-1], δφ_TX[n-1] +β) (retrieve and store)
}
elseif  (P[n-1] > P(δg_TX[n-1], δφ_TX[n-1] -β))
// If the power is reduced by decreasing the phase, ...
{
δg_TX[n] = δg_TX[n-1];
// ... then do not change the gain ...
δφ_TX[n]=δφ_TX[n-1] - β;
// ... validate the phase decrease ...
P[n] = P(δg_TX[n], δφ_TX[n]);
// ... and measure the power with the new gain and phase.
// Alternatively, P[n] = P(δg_TX[n-1], δφ_TX[n-1] -β) (retrieve and store)
}
else
found = true;
// If none of the above decreases the gain,
// then decide that the optimum has been found.
}
```

The size of the gain and phase offset steps may depend on the specific design of the local oscillator and the IQ compensator being used. However, in some modern transceivers such as but not limited to GSM, WCDMA or LTE transceivers or transceivers which are suitable for use with combinations of these systems, suitable step sizes could be in the range of 0.05 dB-0.1 dB for the gain offset steps and in the range of 0.5-1.5 degrees for the phase offset steps. During the optimisation process the algorithm may be used to search over a range of gain and phase offset values. Suitable values for some receivers could be a range of +/−1 dB for the gain offset range and +/−5 degrees for the phase offset range.

Figure 8:
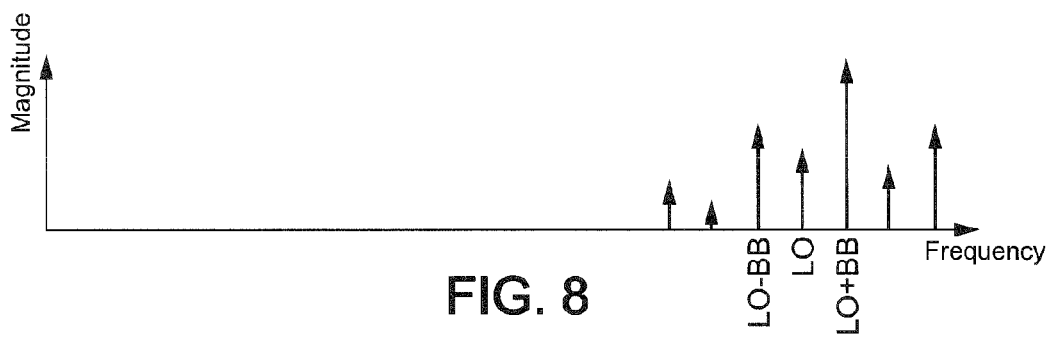
FIG. 8 represents the spectrum of a distorted signal similar to the distorted signal which spectrum is shown on FIG. 4, except that the leakage of the local oscillator of the transmitter is not removed.
Figure 9:
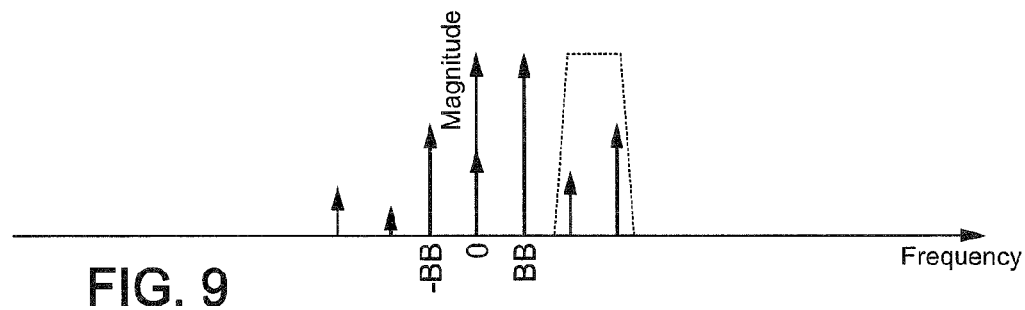
FIG. 9 represents the spectrum of a base band received signal corresponding to the distorted signal which spectrum is shown on FIG. 8.

According to a second variant, it is proposed to not compensate the transmitter local oscillator leakage and the measurement receiver DC offset, which results in a higher number of undesired tones, as illustrated on FIG. 8, which shows the spectrum of a distorted signal without such compensation. FIG. 9 shows the spectrum of the base band received signal corresponding to the signal of FIG. 8.

Figure 6:
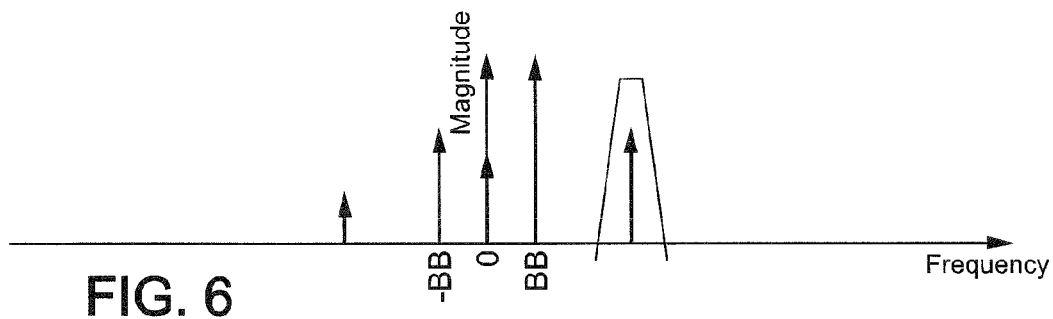
FIG. 6 is a symbolic representation of a band pass filter applied to the signal which the spectrum is shown on FIG. 5.
Figure 7:
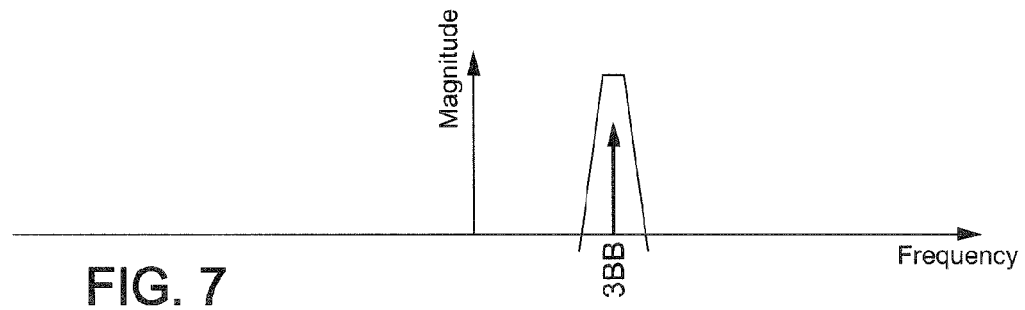
FIG. 7 shows an inter-modulation signal of a signal which spectrum is shown on FIG. 6, wherein the inter-modulation signal in question is to be reduced and is located at a frequency $3*f_{BB}$, $f_{BB}$ being the frequency of the base band signal.

As was discussed in relation to FIG. 6, it is proposed to use a filter (such as a band pass filter) in order to detect the inter-modulation product due to the presence of the image at frequency $3*f_{BB}$ (as shown in FIG. 7).

Alternatively a wider band pass filter could be used to detect the undesired tone at $2*f_{BB}$ as well as the inter-modulation product at $3*f_{BB}$. The method of the invention can then be used to reduce the combined measured power of the signals at $2*f_{BB}$ and at $3f_{BB}$. The centre frequency of the band pass filter could be selected to be at $2.5f_{BB}$. The dotted line filter curve in FIG. 9 illustrates an example.

In general if transmitter LO-leakage and measurement receiver DC offset are not compensated, there are more inter-modulation tones, but the method can still be used for compensating the transmitter LO-leakage and, hence, mRX DC offset, by detecting (with a band pass filter) the inter-modulation product (or products) caused by local oscillator leakage and reducing them. This may require adapting the center-frequency of the band-pass filters. This center frequency may for example be $3*f_{BB}$, as in the compensated variant, or may target another inter-modulation product.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed to be a reference to the plural and vice versa.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

A person skilled in the art will readily appreciate that various parameters disclosed in the description may be modified and that various embodiments disclosed and/or claimed may be combined without departing from the scope of the invention.

It is stipulated that the reference signs in the claims do not limit the scope of the claims, but are merely inserted to enhance the legibility of the claims.

The invention claimed is:

1. A method of providing gain and phase offsets for compensating phase and gain distortions of a transmitter analog front end, the method comprising:
generating a single complex tone signal, wherein the generating comprises compensating a signal gain and a phase with gain and phase offsets;
sending the compensated single complex tone signal to the transmitter analog front end;
receiving an output signal corresponding to the compensated single complex tone signal from a receiver analog front end;
filtering the received output signal to isolate an inter-modulation signal, which is indicative of distortions introduced by the transmitter analog front end;
measuring a first power of the filtered output signal;
updating the gain and phase offsets, and repeating the generating, sending, receiving, filtering and measuring steps above;
measuring a second power of the filtered output signal after the updating;
comparing the first measured power with the second measured power; and
selecting the gain and phase offsets associated with the lowest among first measured power and the second measured power.

2. The method of claim 1 wherein the filtering is carried out using a band pass filter.

3. The method according to claim 1, wherein the gain and phase offsets are initially set to default values depending on the transmitter analog front end.

4. The method according to claim 1, wherein the single complex tone signal is generated as:

$$i_{TX\text{-}BB}(t)=A\cdot\cos(2\pi\cdot f_{BB}\cdot t),$$

$$q_{TX\text{-}BB}(t)=A\cdot\sin(2\pi\cdot f_{BB}\cdot t)$$

where $i_{TX\text{-}BB}$ and $q_{TX\text{-}BB}$ are functions of time t and represent in phase I and quadrature Q components of the single complex tone signal of amplitude A, $f_{BB}$ being a base-band frequency.

5. The method according to claim 4, wherein the filtering is carried out using a band pass filter and the band pass filter is isolating an inter-modulation signal located around frequency $3*f_{BB}$.

6. The method according to claim 4, wherein the filtering is carried out using a band pass filter and the band pass filter is isolating inter-modulation signal located around frequencies $2*f_{BB}$ and $3*f_{BB}$.

7. The method according to claim 1, wherein the updating the gain and phase offsets, and repeating the generating, sending, receiving, filtering and measuring steps are repeated until each of the gain and phase offsets has converged.

8. A non-transitory computer readable storage medium storing one or more stored sequences of instructions that are accessible to a processor and which, when executed by the processor, cause the processor to carry out the steps of claim 1.

9. A digital front end comprising:
a tone generator arranged to generate a single complex tone signal and send it to a transmitter analog front end;
a compensation unit arranged to cause the tone generator to compensate for gain and phase distorsions of the single complex tone signal generated by the tone generator, using gain and phase offsets;

a filter arranged to filter a signal corresponding to the signal complex tone signal and received from a measurement receiver analog front end;

a power measurement unit arranged to measure a power of a filtered signal output by the filter;

an updating unit arranged to update the gain and phase offsets used by the compensation unit; and a processor arranged to compare values of measured power of the filtered signal associated with different gain and phase offsets and to select the gain and phase offsets associated with the lowest measured power, wherein the tone generator generates another signal complex tone signal, compensates it using the updated gain and phase offsets, and sends it to the transmitter analog front end, the filter filters another signal corresponding to the other single complex tone signal, and the power measurement unit arranged measures another power of another filtered signal output by the filter, the power and the other power being included in the values compared by the processor.

10. The digital front end of claim 9, wherein the filter is a band pass filter.

11. The digital front end of claim 9, wherein the compensation unit is arranged to initially set the gain and phase offsets to zero.

12. The digital front end of claim 9, wherein the tone generator generates the single complex tone signal as:

$i_{TX\text{-}BB}(t) = A \cdot \cos(2 \cdot \pi \cdot f_{BB} \cdot t)$, $q_{TX\text{-}BB}(t) = A \cdot \sin(2 \cdot \pi \cdot f_{BB} \cdot t)$ where $i_{TX\text{-}BB}$ and $q_{TX\text{-}BB}$ are functions of time t and represent in-phase, I, and quadrature, Q, components of the single complex tone signal of amplitude A, $f_{BB}$ being a base-band frequency.

13. The digital front end of claim 9 wherein the filter is adapted to isolate an inter-modulation signal located around a frequency of $3*f_{BB}$, $f_{BB}$ being a base-band frequency of the single complex tone signal.

14. The digital front end of claim 9 wherein the filter is adapted to isolate inter-modulation signals located around frequencies of $2*f_{BB}$ and $3*f_{BB}$, $f_{BB}$ being a base-band frequency of the single complex tone signal.

15. A telecommunication device comprising a digital front end according to claim 9.

16. The telecommunication device of claim 15 further comprising an analog system comprising:

a transmitter analog front end, a measurement receiver analog front end, a local oscillator, and a nonlinear component adapted to feed an output of the transmitter analog front end into an input of the measurement receiver analog front end.

17. The telecommunication device of claim 16, wherein the nonlinear component comprises a nonlinear amplifier connected between the output of the transmitter analog front end and the input of the measurement receiver analog front end.

18. The telecommunication device of claim 16 further comprising a switching arrangement arranged to selectively feed the output of the transmitter analog front end into the input of the measurement receiver analog front end.

* * * * *